(12) United States Patent
Irvine et al.

(10) Patent No.: US 6,717,293 B1
(45) Date of Patent: Apr. 6, 2004

(54) ELECTRICAL SAFETY DEVICE

(76) Inventors: Richard S. Irvine, 6510 Gale Avenue North, Sechelt, British Columbia (CA), V0N 3A5; John S. Hodge, 1463 Davidson Road, Gibsons (CA), V0N 1V6

( * ) Notice: Subject to any disclaimer, the term of this patent is extended or adjusted under 35 U.S.C. 154(b) by 0 days.

(21) Appl. No.: 10/604,280

(22) Filed: Jul. 8, 2003

Related U.S. Application Data

(60) Provisional application No. 60/319,994, filed on Mar. 7, 2003.

(51) Int. Cl.[7] ................................................ H02H 1/00
(52) U.S. Cl. ...................................... 307/326; 324/754
(58) Field of Search ........................ 307/326; 439/910; 324/754, 555, 500; 361/736, 807

(56) References Cited

U.S. PATENT DOCUMENTS

| | | |
|---|---|---|
| 5,311,116 A | 5/1994 | Rogers |
| 5,426,360 A | 6/1995 | Maraio et al. |
| 5,463,311 A | 10/1995 | Toy |
| 5,612,620 A | 3/1997 | Heuvel |
| 5,903,438 A * | 5/1999 | Deschamps et al. ........ 361/736 |
| 6,014,027 A | 1/2000 | Reichard |
| 6,118,270 A | 9/2000 | Singer et al. |

* cited by examiner

Primary Examiner—Gregory J. Toatley, Jr.
(74) Attorney, Agent, or Firm—John S. Elniski, Jr.

(57) ABSTRACT

An electrical safety device used with an electrical enclosure and a probe. The electrical safety device including a non-conductive body. The non-conductive body having a front, a mounting body and a rear. The non-conductive body mounted such that the front of the non-conductive body is exposed. The mounting body securing the non-conductive body to the enclosure. The rear of the non-conductive body protected by the enclosure. The electrical safety device including at least one conducting wire entering into the rear of the non-conductive body. The wire having an exposed section within the non-conductive body near the front of the non-conductive body. The exposed section of the wire being a depth from an outside face of the front of the non-conductive body, whereby the depth is enough to prevent passing of electrical current, yet close enough to allow the probe to be activated when electrical current is present in the wire.

25 Claims, 13 Drawing Sheets

ELECTRICAL SAFETY DEVICE

This application claims the benefit of and incorporates by reference U.S. Provisional Application No. 60/319,994 filed Mar. 7, 2003.

BACKGROUND OF INVENTION

The present invention generally relates to devices for determining if electrical power is removed from an electrically powered apparatus, so that the electrically powered apparatus may be safely serviced by an operator. More specifically, the present invention relates to a device which is accessible from the outside of the electrically powered apparatus and is connected to the electrical power source of the electrically powered apparatus, whereby the device is configured to protect an operator of the electrically powered apparatus from the electrical power connected to the device.

High voltage machinery can pose a danger to an operator of the machinery during a malfunction, service or adjustment of the machinery. There are two common dangers in which the operator can be injured due to the electrical power to the machine not being properly turned off. The first is failure of currently available electrical power indication safety devices on the machinery, which give a false indication of the electrical power being off or malfunction and fail to given any indication of whether the electrical power is on or off. The second is inexperience of the operator in determining if the ctrical power is on or off in situations where the safety device fails and in situations where the machinery does not have an electrical power indication safety device. The solution to such dangers is to not allow the operator to work on the machinery until electrical power shutdown is verified by a qualified electrician. Waiting for a qualified electrician can incur additional operating costs, due to down time and the labor of the electrician. An improved solution would be a device which provides a simple process for the operator to verify the electrical power is off and eliminates many of the components of current devices which can malfunction.

It is an object of the present invention to provide a device accessible from an outside of an electrically powered apparatus which allows an operator of the electrically powered apparatus to determine if the electrical power is removed.

It is another object of the present invention to provide a device accessible from an outside of an electrically powered apparatus which will not cause injury to the operator due to contact with the device even if the electrical power of the electrically powered apparatus is on.

SUMMARY OF INVENTION

An electrical safety device used with an electrical enclosure and a probe. The electrical safety device including a non-conductive body. The non-conductive body having a front, a mounting body and a rear. The non-conductive body mounted such that the front of the non-conductive body is exposed. The mounting body securing the non-conductive body to the enclosure. The rear of the non-conductive body protected by the enclosure. The electrical safety device including at least one conducting wire entering into the rear of the non-conductive body. The wire having an exposed section within the non-conductive body near the front of the non-conductive body. The exposed section of the wire being a depth from an outside face of the front of the non-conductive body, whereby the depth is enough to prevent passing of electrical current, yet close enough to allow the probe to be activated when electrical current is present in the wire.

DETAILED DESCRIPTION

Figure 1:
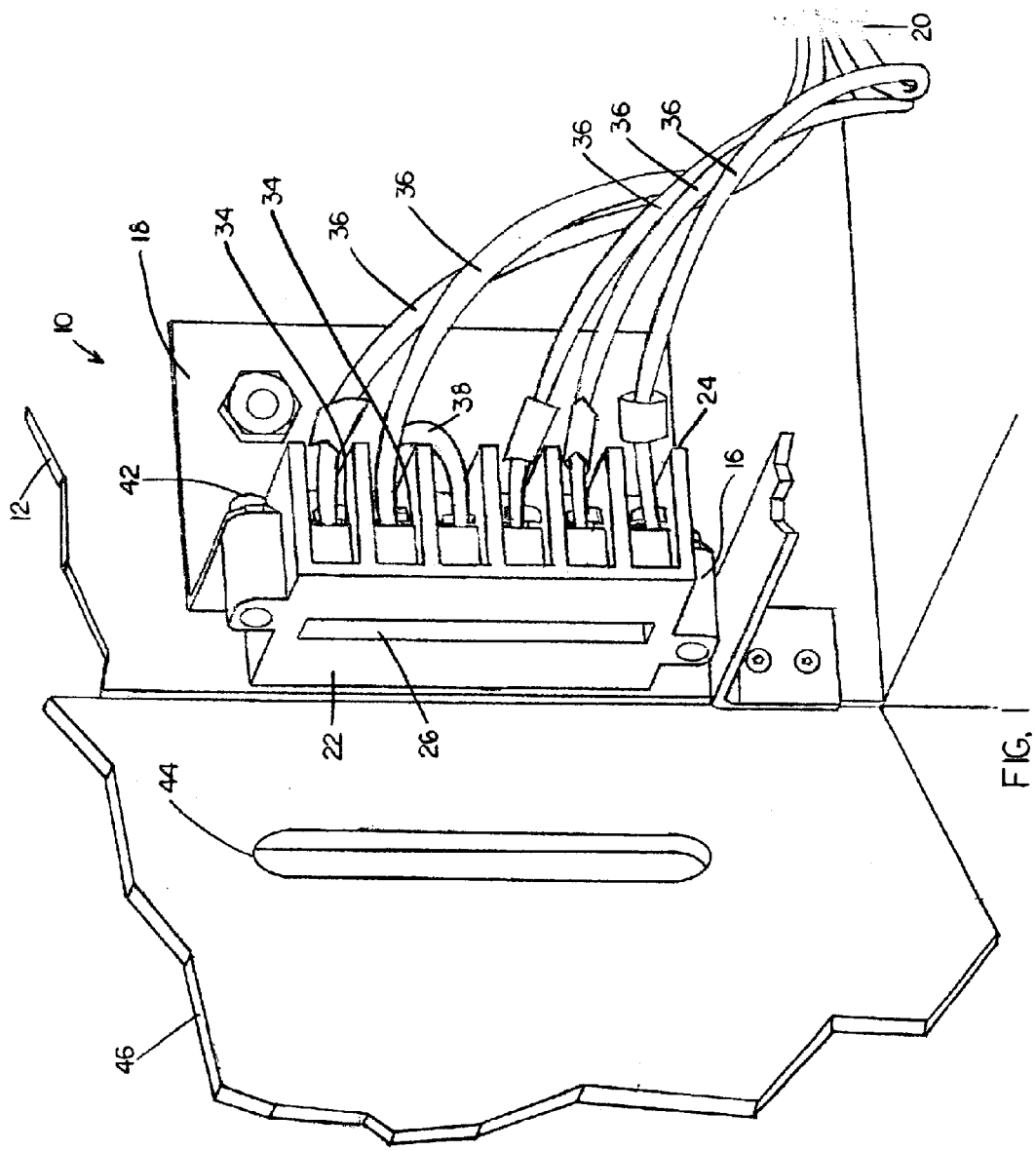
FIG. 1 is a perspective view of an electrical safety device according to the present invention.
Figure 2:
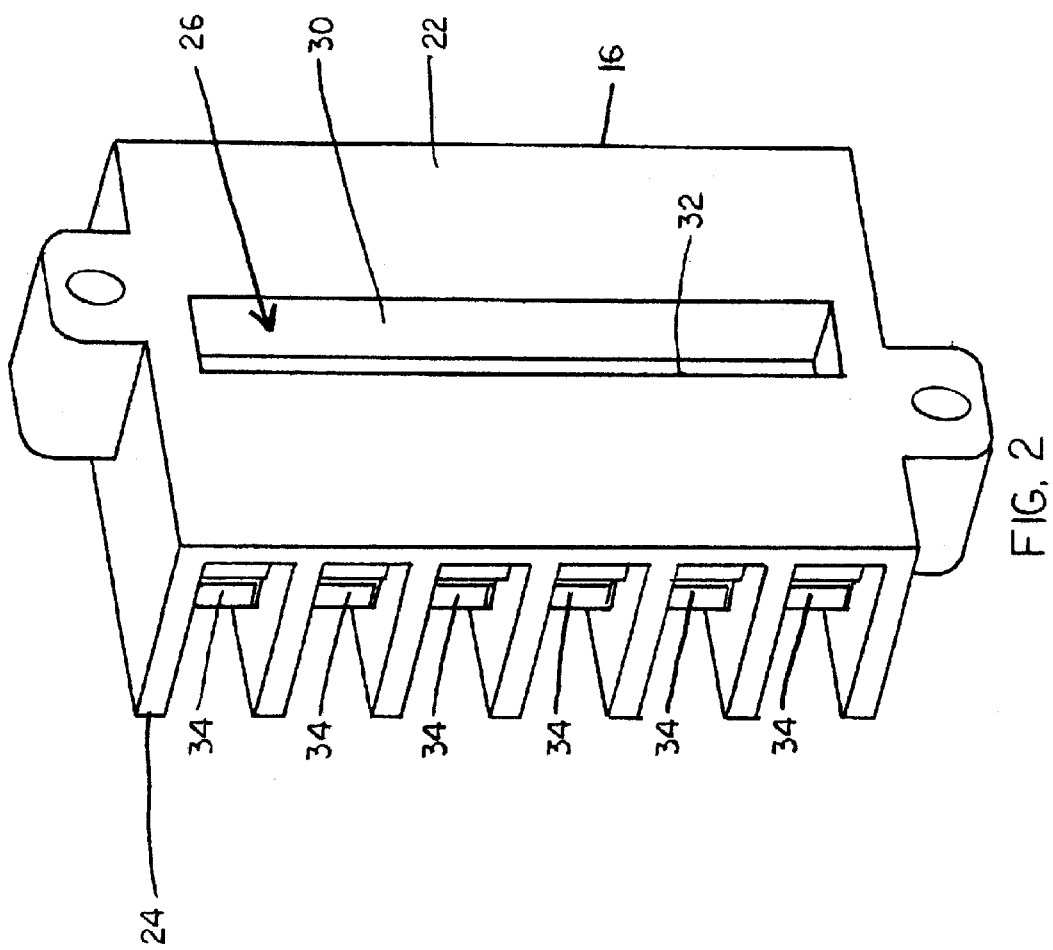
FIG. 2 is a perspective view of a non-conducting body according to the present invention.
Figure 3:
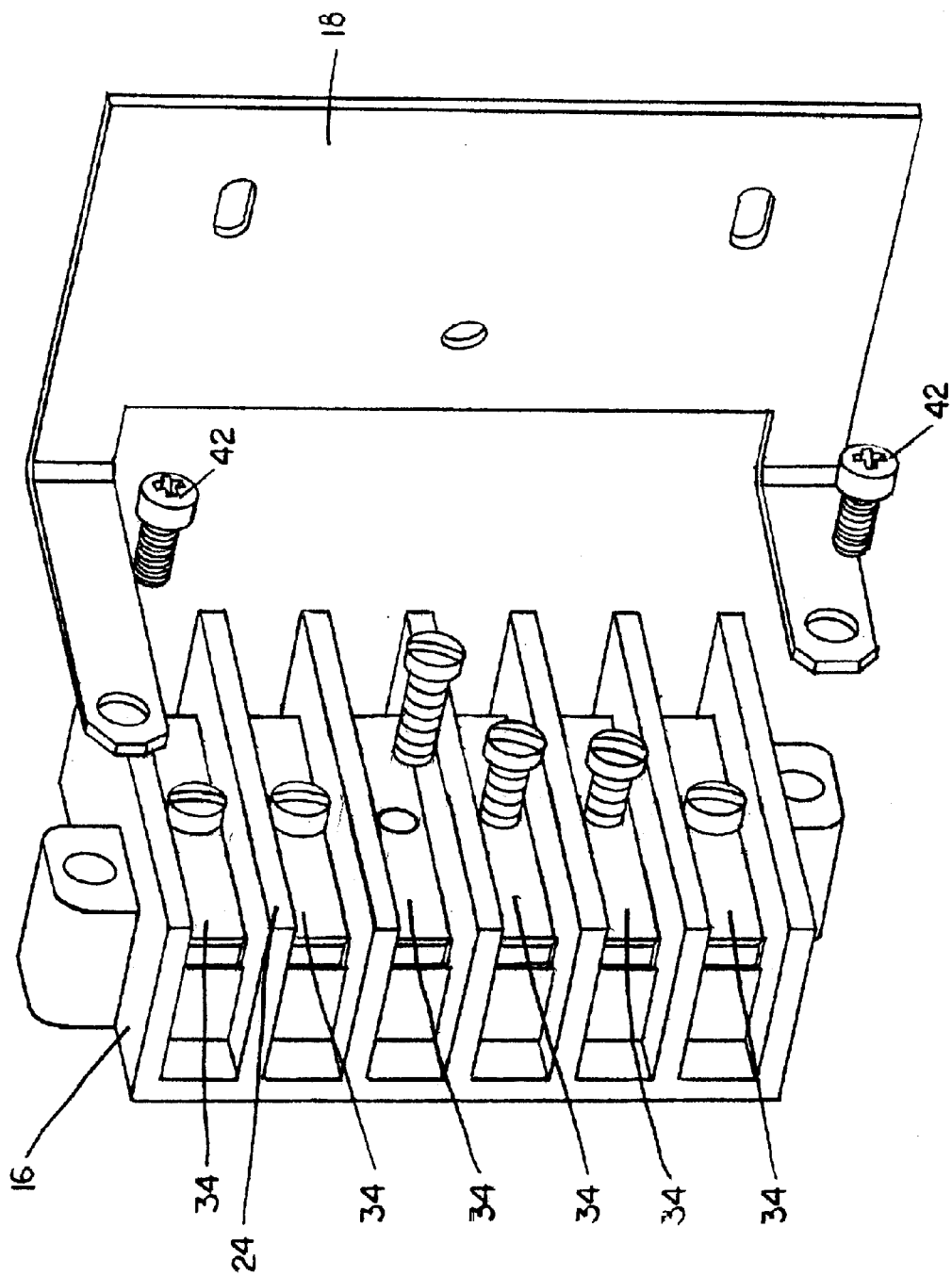
FIG. 3 is a perspective view of a non-conducting body according to the present invention.

The present invention is an electrical safety device 10 as shown in FIGS. 1–13. FIGS. 1–5 show a first version of the electrical safety device 10 and FIGS. 6–9 show a second version of the electrical safety device 10. The electrical safety device 10 positions voltage test points at an outside position of an enclosure 12 of an electrically powered apparatus, such as an electrical starter. The enclosure 12 of an electrical starter typically encloses the electrical power devices and wiring to operate large motors in industrial applications. The enclosure 12 serves the purpose of protecting operators from contacting the electrical power devices and wiring in order to prevent injury of the operators when the electrical power is on. The electrical safety device 10 provides a simplified and cost effective means for the operator to determine if the electrical power in the enclosure 12 has been turned off properly. The electrical safety device 10 is easy to add to existing enclosures 12. Both versions of the electrical safety device 10 include electrical conductors which are energized when the power is turned on. The voltage in the energized electrical conductors can be sensed using a proximity voltage sensor 14 held near the energized electrical conductors, which are enclosed by the electrical safety device 10. The proximity voltage sensor 14 senses the electric field near an energized conductor and indicates the conductor is energized. The indication is usually done by the illumination of a light or lights on the proximity voltage sensor 14. The proximity voltage sensor 14 does not need to be in direct contact with the conductor to sense voltage. It works on the principle of capacitance coupling. The proximity voltage sensor 10 can sense the voltage through an insulated energized electrical conductor and does not need to have current flowing through the energized electrical conductor, but simply needs the energized electrical conductor to be energized with AC voltage. The device used to verify results with the present invention was the Fluke VoltAlert 1 AC, though proximity voltage sensors 14 are manufactured by several different companies. All versions of the electrical safety device 10 not do not require electronics, which increases the reliability of the electrical safety device 10.

Figure 4:
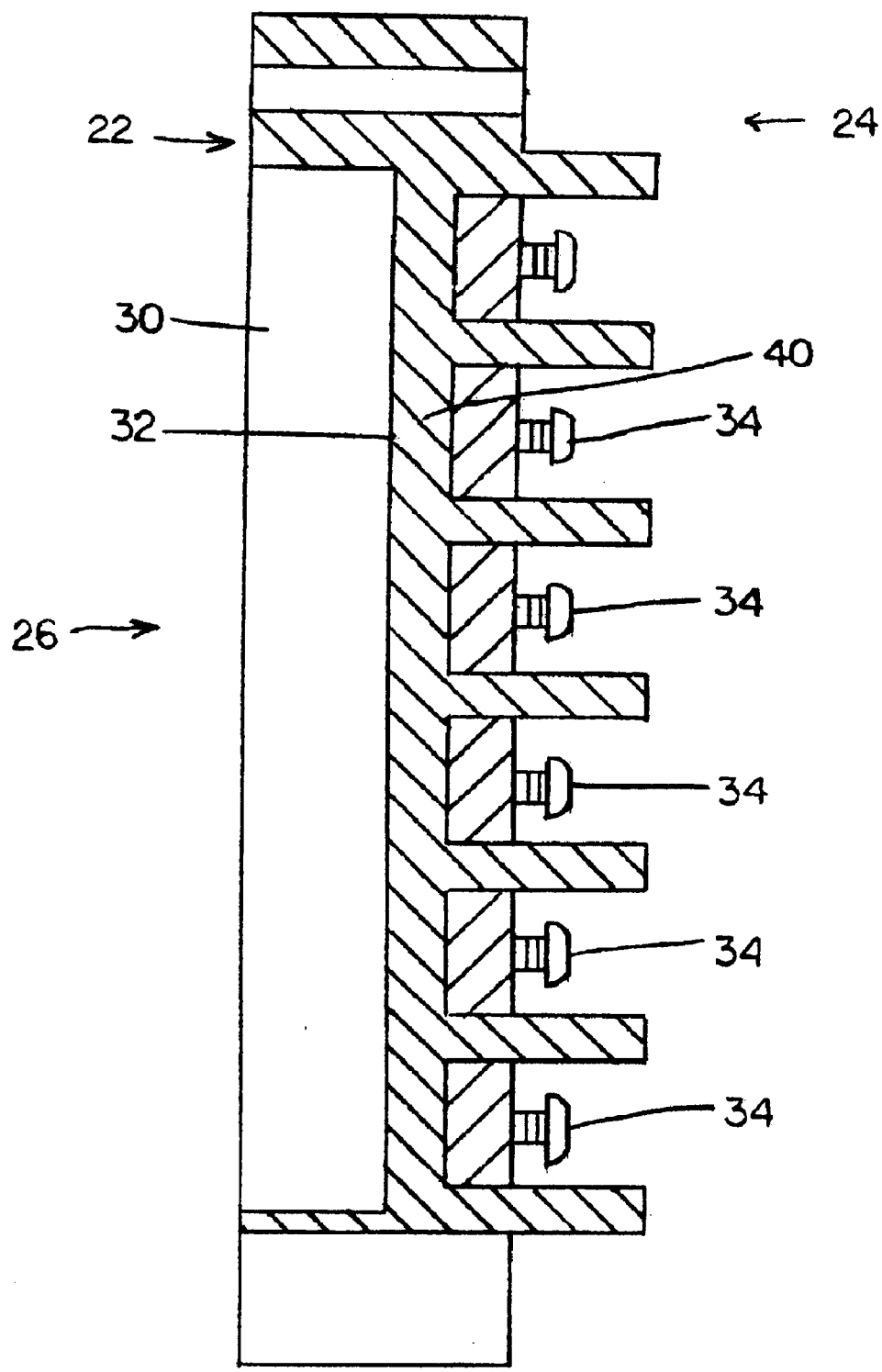
FIG. 4 is a side sectional view of a non-conducting body according to the present invention.
Figure 5:
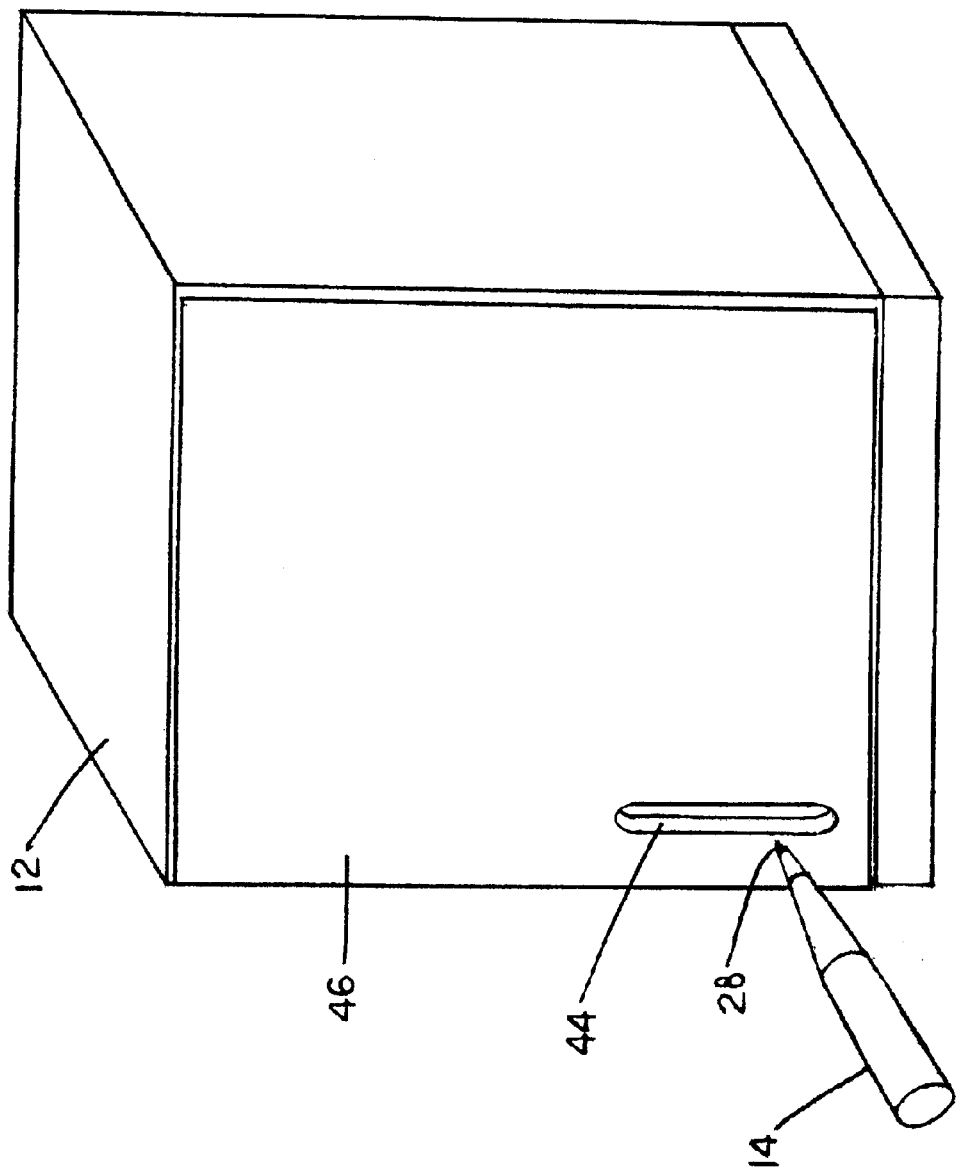
FIG. 5 is a perspective view of an enclosure according to the present invention.

The electrical safety device 10 shown in FIGS. 1–5 is an example of the first version. The electrical safety device 10 includes a non-conductive body 16, support bracket 18 and wire bundle 20. The non-conductive body 16 is typically made of a type 6 nylon natural material, which is a good electrical insulator, as well as being strong. The non-conductive body 16 can be made of any good electrical insulator, such as PVC plastics. The non-conductive body 16 includes a front face 22 and rear face 24. The front face 22 of the non-conductive body 16 includes a slot shaped open cavity 26. The slot shaped open cavity 26 is wide enough to receive a tip 28 of the proximity voltage sensor 14 and has sides 30 and a bottom 32. The rear face 24 includes copper wire terminals 34 embedded into or attached to the non-conductive body 16. Six wire terminals 34 are shown for a typical enclosure 12 that houses the starter electronics for an three phase industrial motor. There are five wires 36 in the wire bundle 20 for a typical enclosure 10 that houses the starter electronics for a three phase industrial motor. Four of the five wires 36 are electrical conductors which can be energized. The fifth wire 36 is a ground wire. The five wires 36 are connected between the wire terminals 34 and the electrical components of the enclosure 12. As an example, a first wire 36 is connected between a first wire terminal 34 and a one-hundred-and-twenty (120) volt component. A second wire 36 is connected between a second wire terminal 34 and a ground source. There is a jumper cable 38 connected between the second wire terminal 34 and the third wire terminal 34. A third wire 36 is connected between a fourth wire terminal 34 and one of the voltage points within the starter for the three phase configuration. A fourth wire 36 is connected between a fifth wire terminal 34 and one of the voltage points within the starter for the three phase configuration. A fifth wire 36 is connected between a sixth wire terminal 34 and one of the voltage points within the starter for the three phase configuration. The current carried by the wires 36 is zero (0)Amps because the wires 36 are "dead-ended" at the wire terminals 34. For this reason the electrical safety device 10 uses no fuses, which means less cost for manufacture and a more reliable device. FIG. 4 shows a layer 40 of non-conducting material between the wire terminals 34 and the slot shaped open cavity 26 which protects the operator from contact with the five wires 36 when they are energized, yet allows the proximity probe 14 to sense voltage.

The support bracket 18 is attached between the non-conductive body 16 and the inside of the enclosure 12 for mounting of the non-conductive body 16. The non-conductive body 16 mounts to the support bracket 18 using mounting screws 42 that screw into the material of the non-conductive body 16. The support bracket 18 can be welded to the enclosure 10 or attached using any other fastening means. The non-conductive body 16 and support bracket 18 are attached to the enclosure 12 such that the front face 22 of the non-conductive body 16 faces a slot shaped test hole 44 in the enclosure 12. The non-conductive body 16 is mounted such that the test hole 44 is aligned with the slot shaped open cavity 26 of the non-conductive body 16, so that the proximity voltage sensor 14 can be inserted into the slot shaped open cavity 26 from outside the enclosure 12. The test hole 44 is shown in a door 46 of the enclosure 12, but could be on any of the outside surfaces of the enclosure 12. It is in the slot shaped open cavity 26 of the non-conductive body 16 that the probe 14 is placed in close proximity to the wire terminals 34 which are shielded by the layer 40 in order to get a reading on voltage presence.

The electrical safety device 10 shown in FIGS. 6–9 is an example of the second version. The second version differs in that it includes additional components to allow testing of voltage presence in the individual wires 36. The second version also illustrates mounting of the electrical safety device 10 to an outside surface of the enclosure 12. In this instance, the electrical safety device 10 is shown mounted to the door 46 of the enclosure 12. As in the first version, the electrical safety device 10 includes a non-conducting body 16 and wires 36 of a wire bundle. The non-conducting body 16 includes a outer shell 50 and inner core 52, which are both made of non-conducting material, such as nylon type 6. The non-conductive body 16 is shown as a round cylinder shape, but is not limited to that shape. The outer shell 50 has a front 54 and a rear 56. The outer shell 50 includes a deep open rear cavity 58 in the rear 56 of the outer shell 50 to receive the inner core 52. The outer shell 50 includes a ground shield plate 60 embedded in the front 54 of the outer shell 50. There is a shallow front cavity 62 in the front 54 of the outer shell 50. The front cavity 62 is sized just large enough to receive the ground shield plate 60 inside the front cavity 62. The ground shield plate 60 is made of a electrical conducting material. The ground shield plate 60 includes a shield ground shaft 64 extending from the rear 66 of the ground shield plate 60 and into a ground shaft hole 68 in the center of the outer shell 50. The ground shaft hole 68 allows the shield ground shaft 64 to extend into the rear cavity 58 of the rear 56 of the outer shell 50. The ground shield plate 60 is shown with five probe holes 70. The outer shell 50 includes five round probe cavities 72 within the front cavity 62 of the outer shell 50. The ground shield plate 60 is placed into the front cavity 62 such that the probe holes 70 and probe cavities 72 are aligned for placement of the tip 28 of the proximity probe 14 into the probe cavities 72. The thickness of material of the outer shell 50 remaining between the probe cavities 72 and the rear cavity 58 is important. This thickness must be thin enough to allow the use of the proximity probe 14 with the components of the inner core 52, but thick enough to provide the required insulation value for the level of voltage being detected. A thickness of one-eighth of an inch has proved best for testing the presence of voltage.

Figure 6:
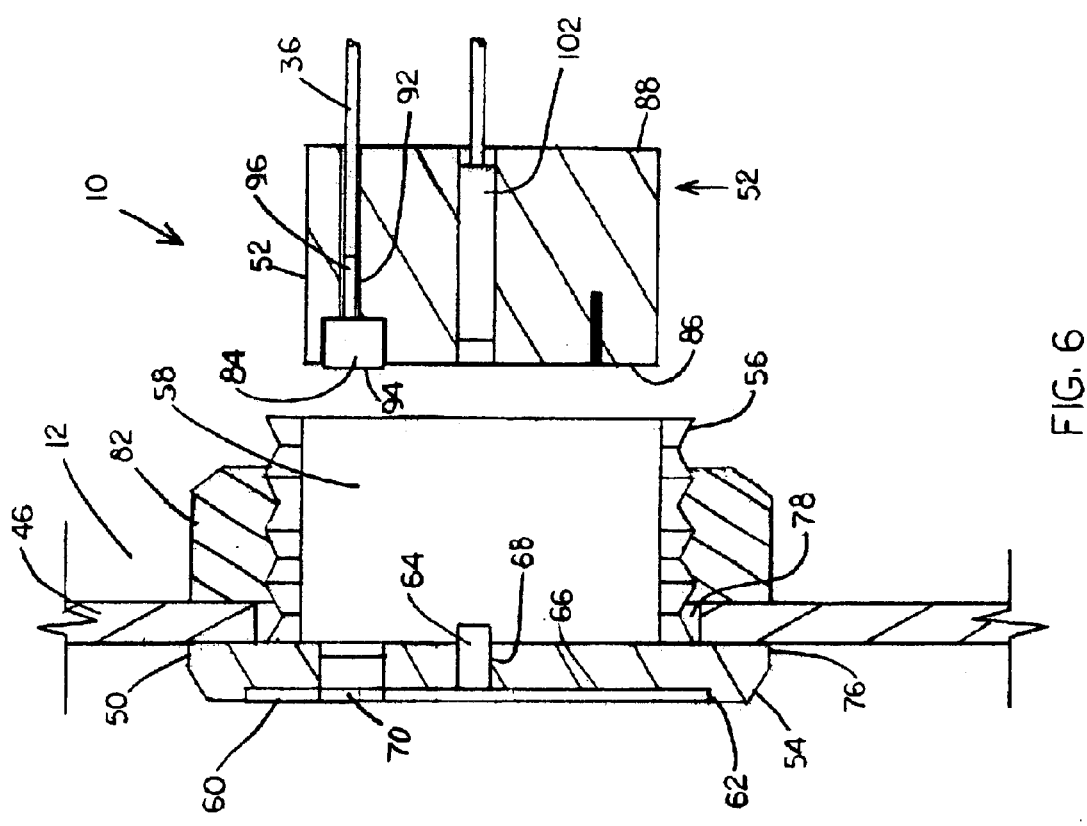
FIG. 6 is a side sectional view of a non-conducting body according to the present invention.
Figure 7:
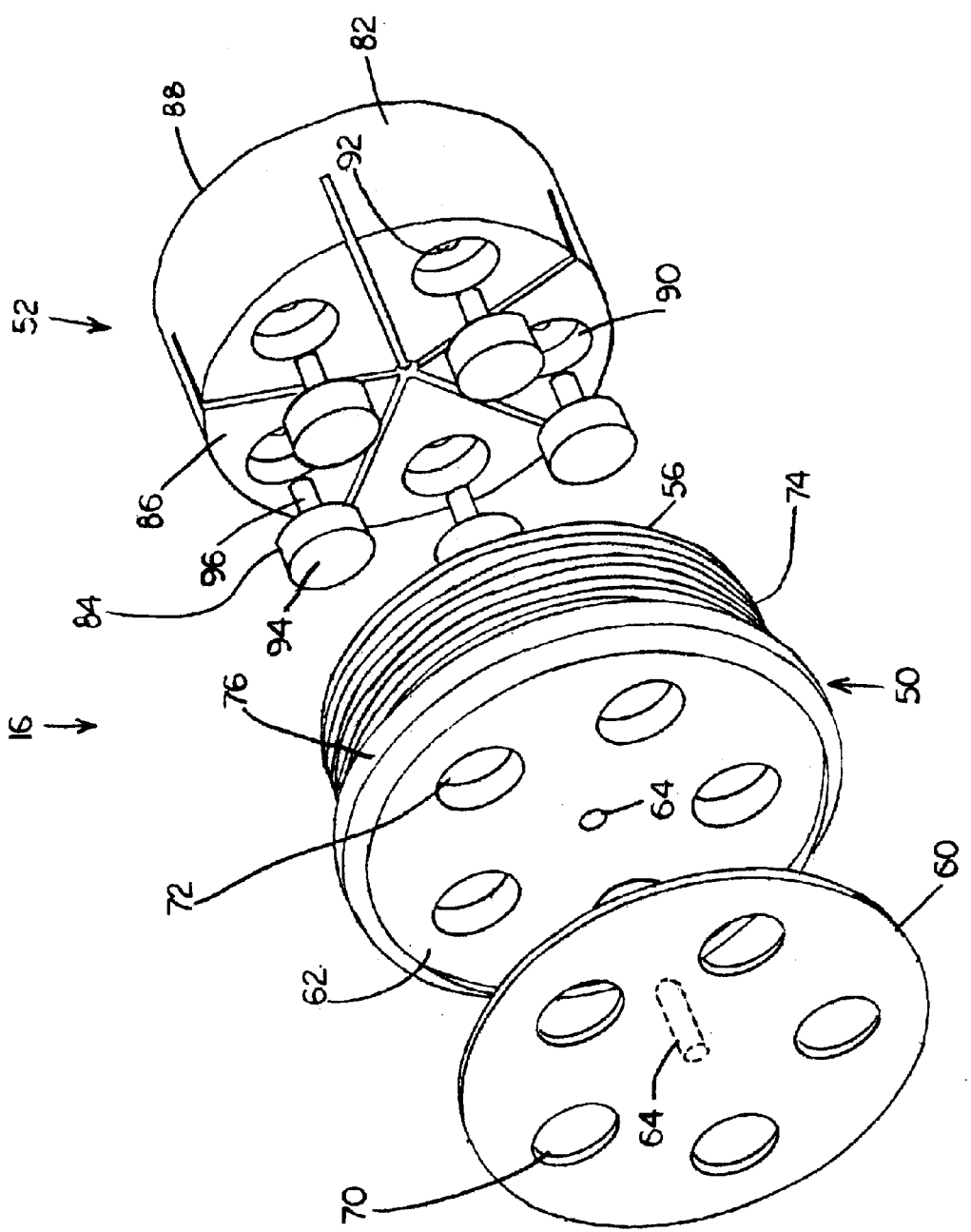
FIG. 7 is a perspective view of a non-conducting body according to the present invention.
Figure 8:
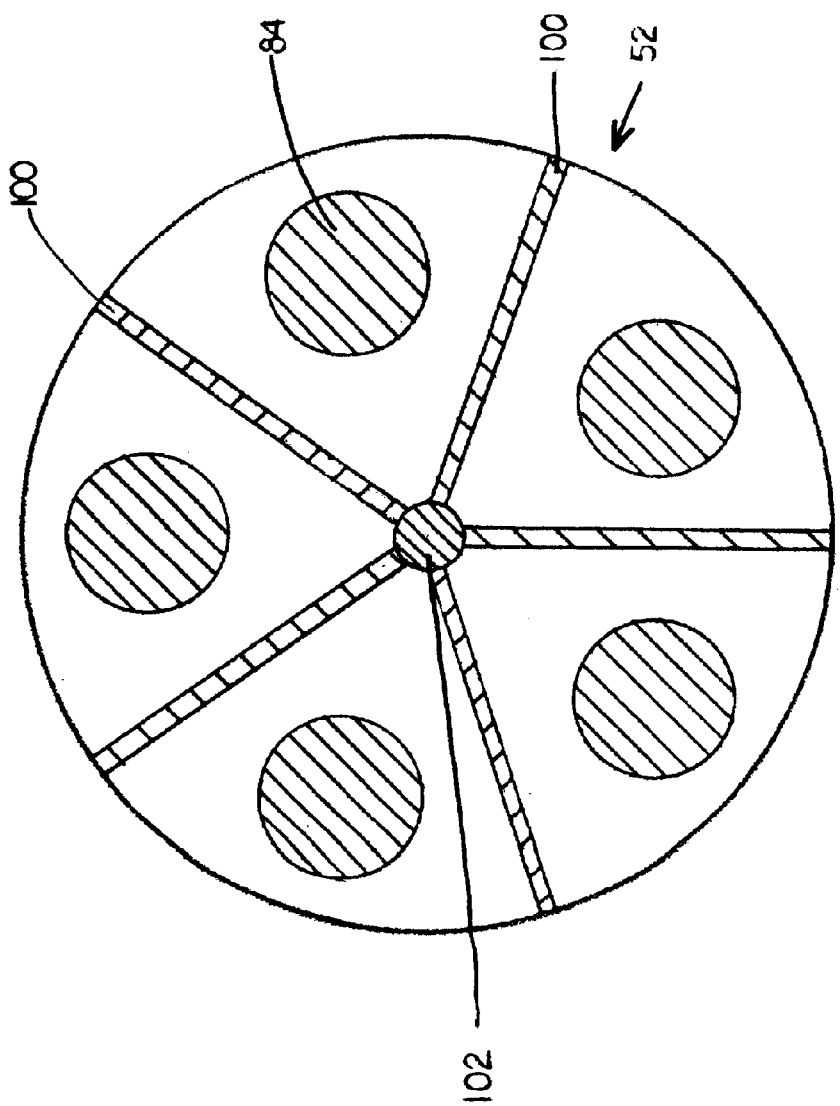
FIG. 8 is a front view of a non-conducting body according to the present invention.
Figure 9:
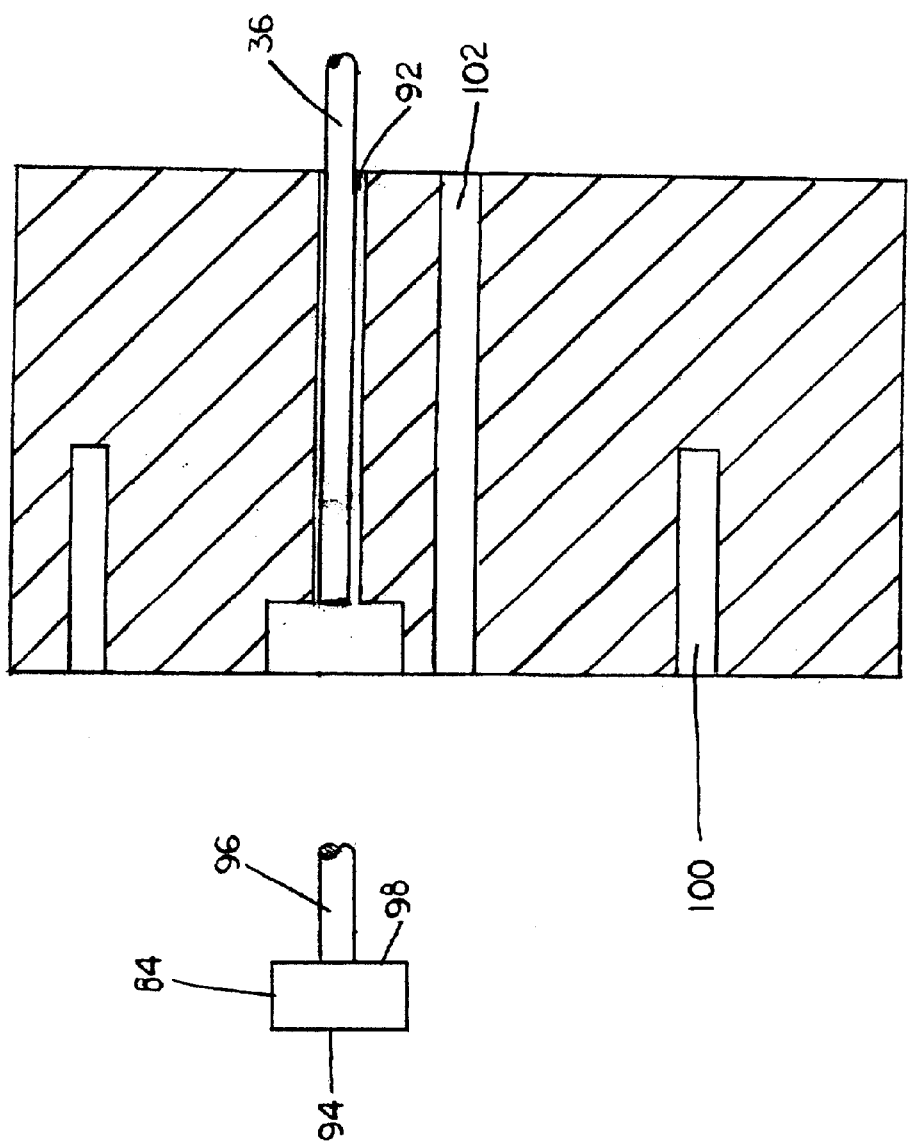
FIG. 9 is a side sectional view of a non-conducting body according to the present invention.

The rear 56 of the outer shell includes a necked down threaded outside surface 74. There is a lip 76 formed between the necked down threaded outside surface 74 and the remaining portion of the outside of the outer shell 50. The necked down threaded outside surface 74 is used for mounting the outer shell 50 to the outer surface of the enclosure 12. In FIG. 6, the outer shell 50 is mounted to the door 46 of the enclosure 12. The door 46 includes an outer shell hole 78 sized large enough to allow the necked down threaded outside surface 74 to pass through the front of the door 46, but small enough to prevent the lip 76 from passing through the door 46. A lock nut 80 is threaded onto the necked down threaded outside surface 74 after the necked down threaded outside surface 74 has passed through the outer shell hole 78. The lock nut 80 retains the outer shell 50 on the door 46.

The inner core 56 is inserted into the rear cavity 58 of the outer shell 50. The inner core 56 is held in place either by a pressure fit or by an adhesive. The inner core 52 includes a inner core body 82 and button connectors 84. The inner core body 82 is a solid piece of non-conducting material with front 86, rear 88 and five connector cavities 90 in the front 86. The connector cavities 90 receive the button connectors 84. The inner core 52 is inserted into the outer shell 50 such that each button connector 84 is aligned with the each of the probe cavities 72 and probe holes 70. The connector cavities 86 each include a wire hole 92 to allow the five wires 36 of the wire bundle to pass from the rear 88 of the inner core body 82 onto the button connectors 84. The button connectors 84 include a button shaped conducting surface 94 and a hollow sleeve 96 extending from the rear 98 of the contact surface 94. The conducting surface 94 and hollow sleeve 96 are of a electrical conducting material, such as brass and the hollow sleeve 96 is electrically connected to the conducting surface 94. Each of the five wires 36 is inserted into one of each of the five wires holes 92 and soldered into the hollow sleeve 96 of the button connector 84. The button connector 84 serves in the same capacity as the wire terminals 34 of the first version. The inner core 52 includes a inner core ground shaft 100 in the center of the inner core 52. The inner core ground shaft 100 is connected to a sixth wire 36 of the wire bundle that is a ground wire. The inner core ground shaft 100 is configured to connect and contact the shield ground shaft 64 when the inner core 52 is inserted into the outer shell 50. The inner core 52 also includes five ground spoke plates 102 at the front 86 of the inner core 52. The ground spoke plates 102 each extend from the inner core ground shaft 100 outward to the outside edge of the inner core 52. The ground spoke plates 102 should have a depth of at least the thickness of the button connector 84. It is also recommended to have a wire strain relief as part of the rear 88 of the inner core 52 where the wires 36 of the wire bundle first enter. As with the first version, no fusing of wires 36 is necessary. The reason for this is that the wires 36 are "dead-ended" at the buttons conductors 84. This is important because the device 10 costs less to manufacture and promotes a fail-safe device in that there are no fuses to "open" for whatever reason. It is believed that the button conductors 84 should be the same diameter as the probe holes 70 to promote voltage presence sensitivity within the hole 70.

The use of the two versions is as follows. To use electrical safety device 10 of the first version, first test the proximity probe 14 at a known voltage source. Next, turn off the power to the enclosure 12 and place the tip 28 of the proximity probe 14 into the slot shaped open cavity 26 near the first wire terminal 34. With the power off, there should be no indication of voltage by the proximity probe 14 at the first wire terminal 34. With the second and third wire terminals 34 being grounded, there should be no bleed over from a voltage field produced by wires 36 three through five, if wires 36 three through five are still energized. It is possible that only one grounded wire terminal 34 would be enough to prevent voltage fields from bleeding over, but a second grounded wire terminal 34 provides an improved margin of safety. Next, place the tip 28 of the proximity probe 14 into the slot shaped open cavity 26 near the fourth through sixth wire terminals 34. With the power off, there should be no indication of voltage by the proximity probe 14 at the fourth through sixth wire terminals 34. Again, due to the grounded wire terminals 34, there should be no bleed over of voltage field from the first wire 36.

To use electrical safety device 10 of OLE_LINK1 the second version OLE_LINK1, place, first test the proximity probe 14 at a known voltage source. Next turn off the power to the enclosure 12 and place the tip 28 of the proximity probe 14 into the probe holes 70 and on into the probe cavities 72. With the power off, there should be no indication of voltage by the proximity probe 14 in each probe hole 70. The electrical safety device 10 of the second version provides grounded separation between each probe hole 70 and probe cavity 72 combination due to the ground shield plate 60, shield ground shaft 64, ground spoke plates 102, inner core ground shaft 100 and the ground wire. This grounded separation prevents the voltage field from bleeding over from the other probe cavities 72 when placing the tip 28 of the proximity probe 14 into one of the probe cavities 72.

It should be noted that the electrical safety device 10 of the first version could be mounted directly to a wall of the enclosure 12 which has the test slot 44 or could be mounted to the outside of the enclosure 12. Also, the electrical safety device 10 of the second version could be mounted inside the enclosure 12 in a similar fashion as described in version one, whereby the test slot 44 could be replaced by a large round hole or several probe sized holes aligned with the probe holes 70.

Figure 10:
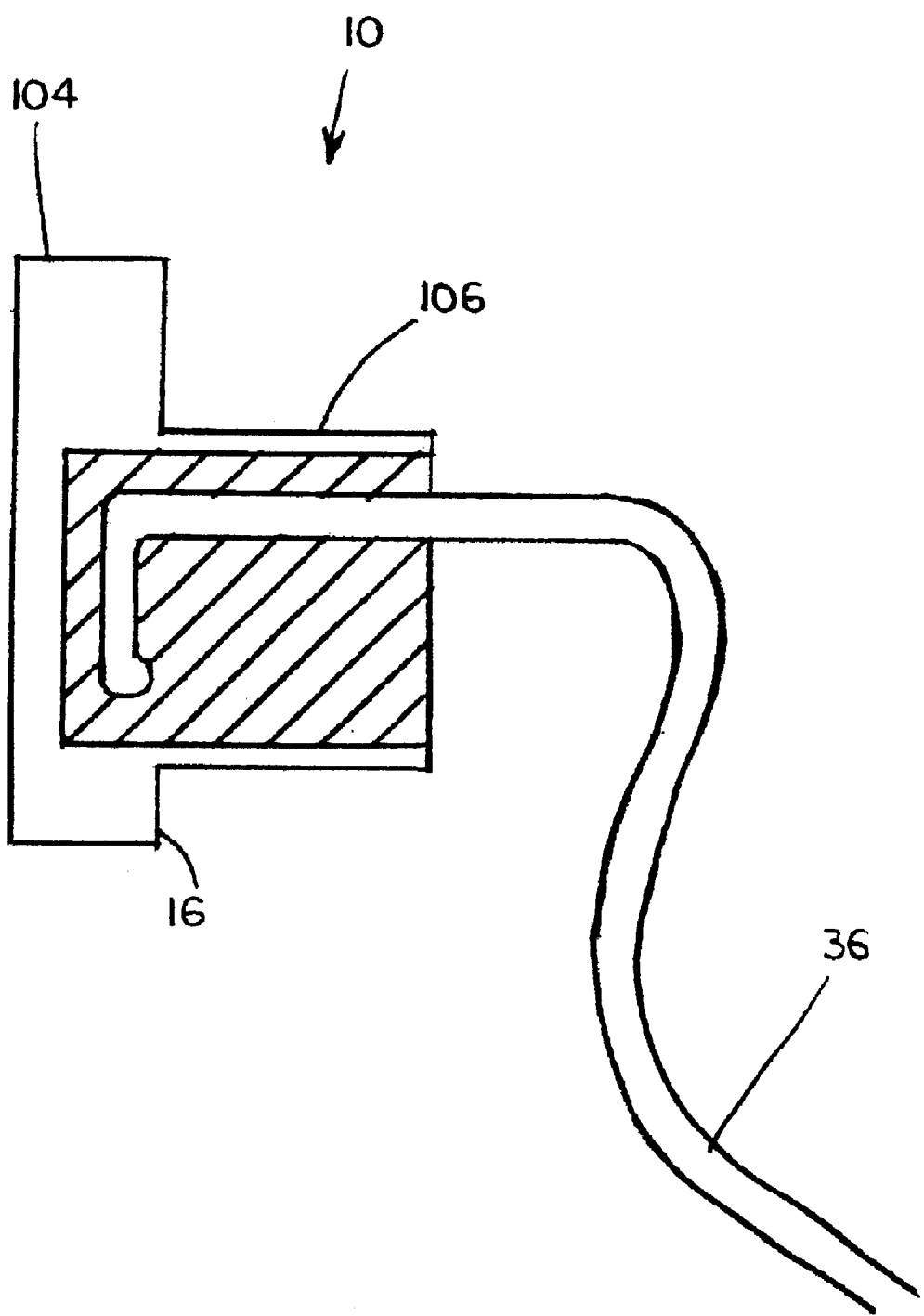
FIG. 10 is a side cut-a-way view of a non-conducting body according to the present invention.
Figure 11:
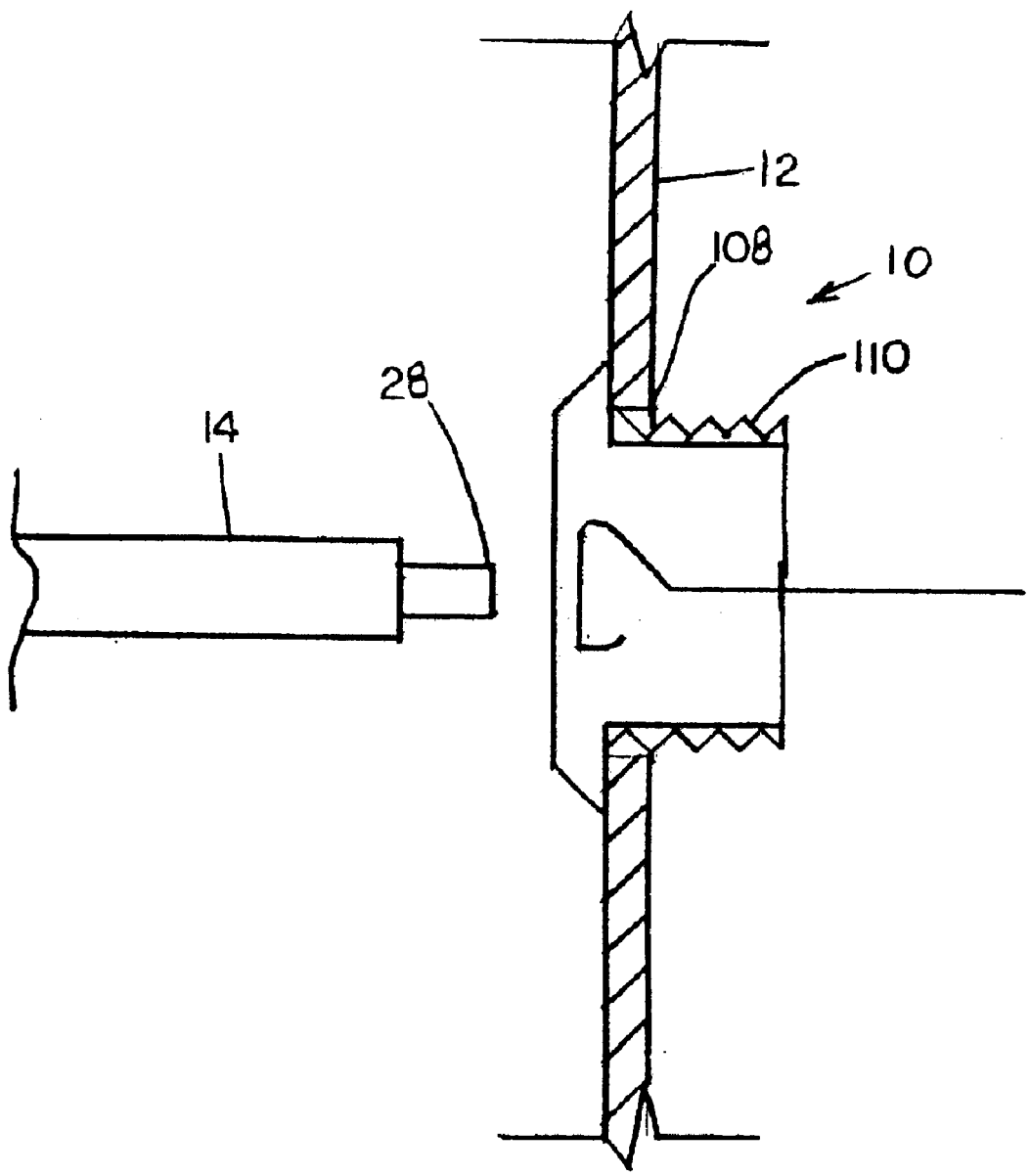
FIG. 11 is a side view of an electrical safety device according to the present invention.
Figure 12:
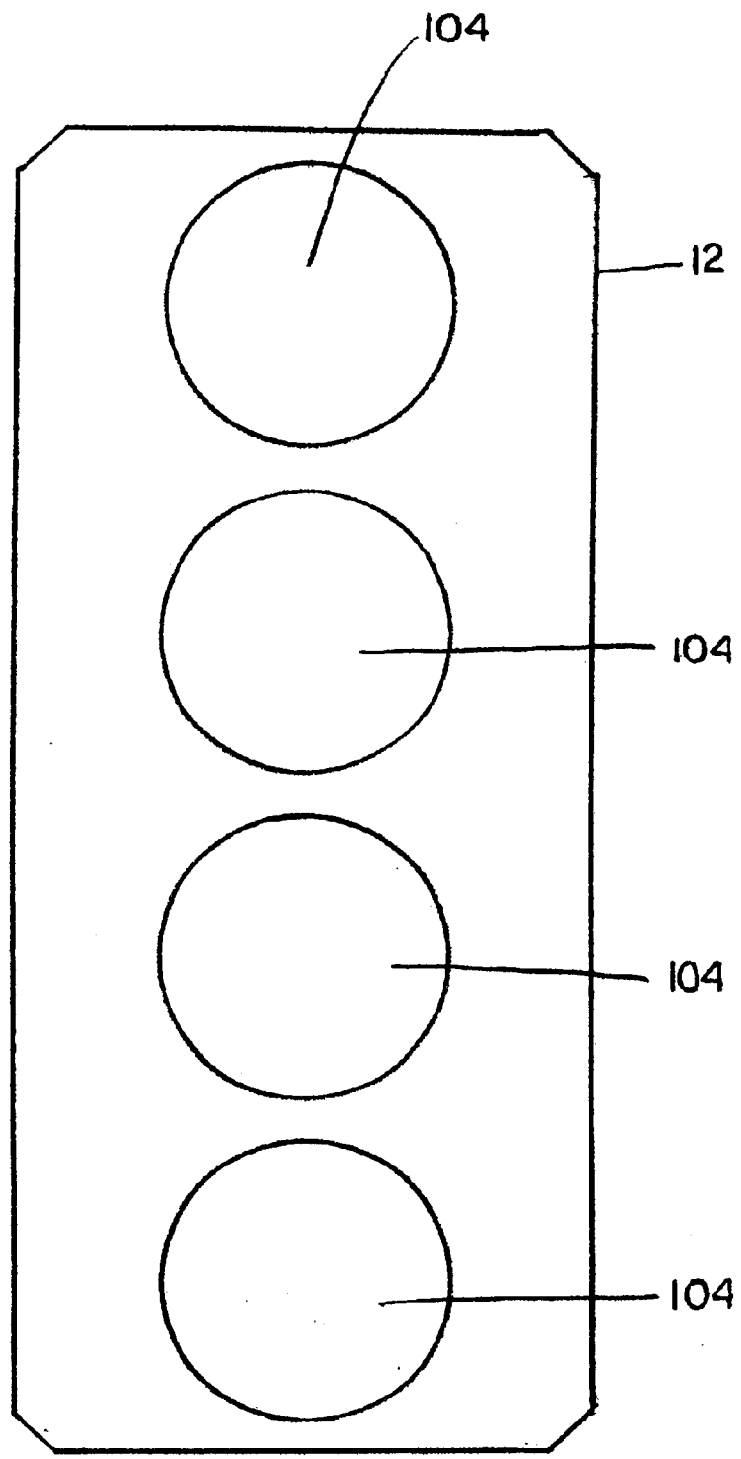
FIG. 12 is a front view of an electrical safety device according to the present invention.

FIGS. 10–12 show a simpler version of electrical safety device 10 which can be mounted directly to the enclosure 12, inside the enclosure 12 or remotely located from the enclosure 12. The simpler version of FIGS. 10–12 is the base model for all of the versions of the present invention, including the versions discussed above. FIG. 10 shows a non-conductive body 16 composed of a non-conductive material having a front face 104 and a rear mounting section 106. The non-conductive body 16 of FIG. 10 can be mounted by inserting the rear mounting section 106 in a hole 108, as shown in FIG. 11. The rear mounting section 106 can be held in place by friction fit, locknut, gluing, threaded hole or other means to maintain the rear mounting section 106 in the hole 108. FIG. 11 shows the non-conducting body 16 attached to the enclosure 12 by inserting the rear mounting section 106 into the hole 108 of the enclosure 12. The non-conducting body 16 is shown retained by slightly flexible barbs 110 on the outside of the rear mounting section 106. The non-conductive body 16 can take on many different shapes. The front face 104 of the non-conductive body 16 can be concave, convex, flat, protruding, recessed or flush, as compared to the surface the non-conductive body 16 is mounted. A protruding flat face 104 is shown in FIGS. 10–12. No cavity is required for the proximity probe 14. The proximity probe 14 need only be held at the front face 104. A wire 36 is shown as the conductor connected to a voltage source to be detected. The wire 36 can be an insulated conductor such as a common wire and can be held behind the front face of the non-conductive body by several methods. The wire 36 can be held in the rear mounting section 106 using non-conductive epoxy, non-conductive glue, a non-conductive plug, or by force fitting the wire into a hole in the rear of the rear mounting section 106. FIG. 12 shows front view of the front face 104 of four non-conductive bodies mounted to an enclosure 12. If the version of FIGS. 10–12 is placed on a grounded enclosure 12 and spaced apart enough so that there is no need for a ground shield. The grounded enclosure 12 acts as the ground shield. The distance of the end of the wire 36 from the front surface of non-conductive body 16 is a function of the voltage level sought to indicate the presence of voltage. The wire 36 can be enlarged to increase the magnitude of the signal for the probe 14. Preferred method of manufacturing this simple version would be by injection molding.

Figure 13:
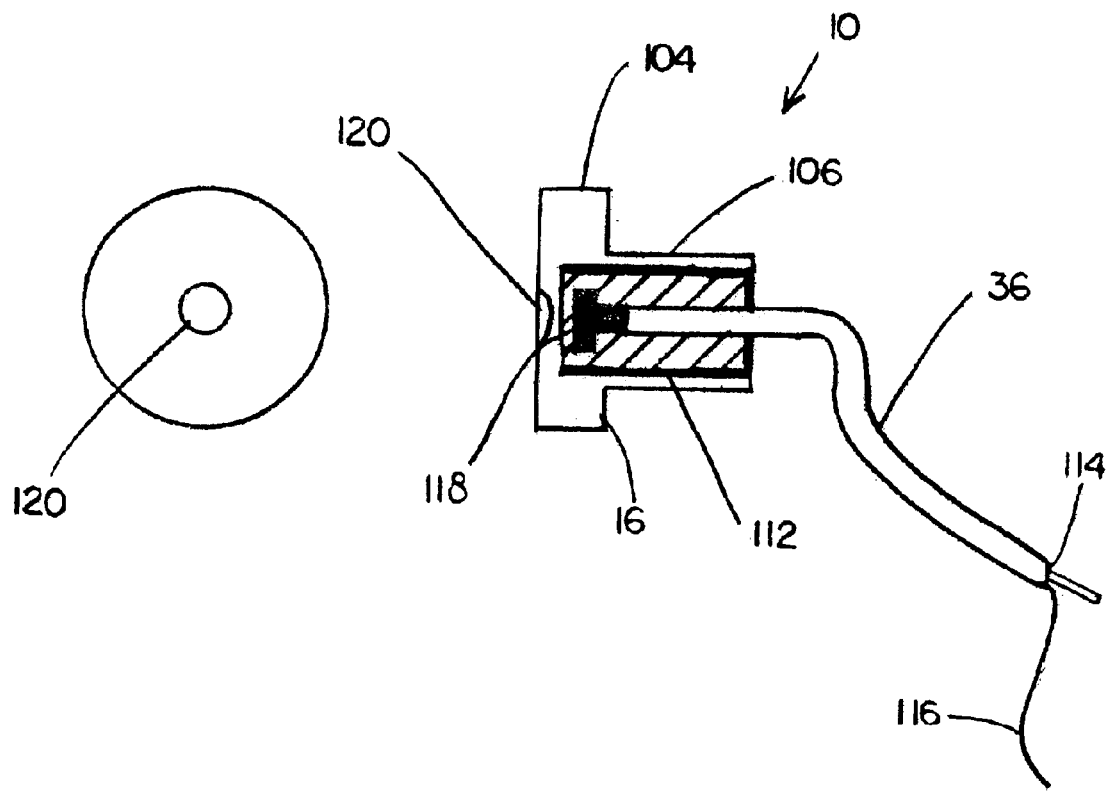
FIG. 13 is a side cut-a-way and front view of a non-conducting body according to the present invention.

FIG. 13 shows yet another version of the present invention which is similar to the version shown in FIGS. 10–12. FIG. 13 shows as cut-a-way side view and front view of a non-conductive body 16 composed of any non-conductive material having a front face 104 and a rear mounting section 106. The differences are as follows. Within the rear mounting section 106 is a layer of electrical shielding 112 about the wire 36 and the rear of the rear mounting section 106. The wire 36 is also covered by a layer of electrical shielding 114. The electrical shielding 112 of the rear mounting section 106 and electrical shielding 114 about the wire 36 can be connected together. The electrical shielding 114 about the wire can be connected to a ground by a tail wire 116 between the electrical shielding 114 about the wire 36 and the ground. This prevents other equipment in the enclosure from influencing the electrical safety device 10. Also, a terminal button 118 connected to the end of the wire 36 is shown in the non-conductive body 16. Finally, the front face 104 shows a dimple shaped cavity 120 in the middle of the face 104 to aid in positioning the probe 14 properly.

Each version discussed above can include any of component elements of any of the other versions discussed and the different versions are for illustrative purposes. The present invention allows an unskilled worker to safely verify the presence of voltage without the exposure to electrical hazards with removing covers, opening doors or destroying seals. It is envisioned that mixing of attributes of the above different versions will be performed to fit the particular needs of the user. Therefore, while different embodiments of the invention have been described in detail herein, it will be appreciated by those skilled in the art that various modifications and alternatives to the embodiments could be developed in light of the overall teachings of the disclosure. Accordingly, the particular arrangements are illustrative only and are not limiting as to the scope of the invention that is to be given the full breadth of any and all equivalents thereof.

What is claimed is:

1. An electrical safety device, used in combination with an electrical enclosure and a proximity probe, comprising:
   a non-conductive body mounted to said electrical enclosure;
   said non-conductive body having a front, a mounting body and a rear;
   at least any exposed parts of said non-conductive body from outside said enclosure being made of a non-conductive material;
   said non-conductive body mounted such that said front of said non-conductive body is exposed to an outside of said enclosure so that said probe has access to said front of said non-conductive body;
   said mounting body of said non-conductive body configured to secure said non-conductive body to said enclosure;
   said rear of said non-conductive body positioned such that said rear of said non-conductive body is protected by said enclosure;
   at least one conducting wire leading from a voltage source and entering into said rear of said non-conductive body;
   said wire having an exposed section within said non-conductive body near said front of said non-conductive body;
   said exposed section of said wire being a depth from an outside face of said front of said non-conductive body, whereby said depth is enough to prevent passing of electrical current, yet close enough to allow said probe to be activated when electrical current is present in said wire.

2. The electrical safety device of claim 1, further including a wire terminal within said non-conductive body near said front of said non-conductive body to receive said exposed section of wire.

3. The electrical safety device of claim 1, wherein said exposed front of said non-conductive body includes at least one cavity acting as a guide to said probe.

4. The electrical safety device of claim 1, further including electrical shielding within said non-conductive body to shield said wire.

5. The electrical safety device of claim 1, wherein said wire is an electrically shielded wire.

6. The electrical safety device of claim 1, further including:
   at least one open cavity in said front of said non-conductive body to receive the probe, said at least one open cavity accessible from outside said electrical enclosure, said at least one open cavity including sides and bottom, said sides and bottom being made of said non-conductive material and defining said cavity; and
   at least one wire terminal in said rear of said non-conductive body to receive said wire, said at least one wire terminal positioned behind said bottom of said at least one open cavity, whereby said bottom is a layer of non-conductive material.

7. The electrical safety device of claim 6, wherein said non-conductive body is mounted within said electrical enclosure and wherein said electrical enclosure includes a test hole on an outside surface of said electrical enclosure which is aligned with said at least one open cavity to allow the probe to pass through said electrical enclosure and into said at least one open cavity.

8. The electrical safety device of claim 6, wherein said non-conductive body is mounted on an outside surface of said electrical enclosure and wherein said non-conductive body is configured such that at least one wire from said electrical enclosure passes through said outside surface in a protected manner and is connected to said at least one wire terminal.

9. The electrical safety device of claim 6, wherein there is a plurality of wire terminals in said rear of said non-conductive body to receive a plurality of wires and wherein said plurality of wire terminals are positioned behind said bottom of said at least one open cavity.

10. The electrical safety device of claim 9, wherein at least one of said wires is a ground wire connected to one of said wire terminals that is positioned between two non-grounded wires to act as a shield to prevent bleed over of a voltage field to the probe when the probe is placed in said at least one open cavity.

11. The electrical safety device of claim 7, wherein there is a plurality of wire terminals in said rear of said non-conductive body to receive a plurality of wires; wherein said plurality of wire terminals are positioned behind said bottom of said at least one open cavity; and wherein at least one of said wires is a ground wire connected to one of said wire terminals that is positioned between two non-grounded wires to act as a shield to prevent bleed over of a voltage field to the probe.

12. The electrical safety device of claim 8, wherein there is a plurality of wire terminals in said rear of said non-conductive body to receive a plurality of wires; wherein said plurality of wire terminals are positioned behind said bottom of said at least one open cavity; and wherein at least one of said wires is a ground wire connected to one of said wire terminals that is positioned between two non-grounded wires to act as a shield to prevent bleed over of a voltage field to the probe.

13. The electrical safety device of claim 7, wherein said front of said non-conductive body is against an inside surface of said electrical enclosure.

14. The electrical safety device of claim 6, wherein there is a plurality of open cavities in said front of said non-conductive body to receive the probe, said open cavities each accessible from outside said electrical enclosure, said open cavities each including sides and bottom, said sides and bottom being made of said non-conductive material; and wherein there is a wire terminal for each of said open cavities positioned in said rear of said non-conductive body behind said bottom of each of said open cavities.

15. The electrical safety device of claim 14, further including a ground shield plate mounted to said front of said non-conductive body; wherein said ground shield plate includes a probe hole for each of said open cavities to allow the probe to pass through to said open cavities; and wherein said ground shield plate is grounded.

16. The electrical safety device of claim 15, further including a ground spoke plate between each wire terminal that is positioned inside said non-conductive body; and wherein said ground spokes are grounded.

17. The electrical safety device of claim 14, wherein said wire terminals are button connectors to which said wires are connected.

18. The electrical safety device of claim 14, wherein said non-conductive body is mounted to an outside surface of said electrical enclosure; wherein said electrical enclosure includes a mounting hole for mounting of said non-conductive body; wherein said non-conductive body includes a threaded rear portion acting as part of said mounting body which fits through said mounting hole from outside said electrical enclosure; further including a lip between said front and said threaded rear portion of said non-conductive body which prevents a front portion of said non-conductive body from passing through said mounting hole; and further including a lock nut which screws onto said threaded rear portion and against an inside surface of said electrical enclosure to secure said non-conductive body to said electrical enclosure.

19. The electrical safety device of claim 15, wherein said non-conductive body includes an outer shell and an inner core; wherein said outer shell includes a ground shield cavity to receive said ground shield plate; wherein said open cavities are within said ground shield cavity; wherein said outer shell includes an inner core cavity in a rear of said outer shell to receive said inner core; wherein said inner core includes wire terminal cavities to receive said wire terminals such that said wire terminals are behind said bottoms of said open cavities and further including a plurality of ground spoke plates in said inner core that are grounded, whereby there is one of said ground spoke plates between each wire terminal.

20. The electrical safety device of claim 17, further including a ground shield plate mounted to said front of said non-conductive body; wherein said ground shield plate includes a probe hole for each of said open cavities to allow the probe to pass through to said open cavities; and wherein said ground shield plate is grounded.

21. The electrical safety device of claim 20, further including a ground spoke plate between each wire terminal that is positioned inside said non-conductive body; and wherein said ground spokes are grounded.

22. The electrical safety device of claim 18, further including a ground shield plate mounted to said front of said non-conductive body; wherein said ground shield plate includes a probe hole for each of said open cavities to allow the probe to pass through to said open cavities; and wherein said ground shield plate is grounded.

23. The electrical safety device of claim 22, further including a ground spoke plate between each wire terminal that is positioned inside said non-conductive body; and wherein said ground spokes are grounded.

24. The electrical safety device of claim 22, wherein said non-conductive body includes an outer shell and an inner core; wherein said outer shell includes a ground shield cavity to receive said ground shield plate; wherein said open cavities are within said ground shield cavity; wherein said outer shell includes an inner core cavity in a rear of said outer shell to receive said inner core; wherein said rear threaded portion is part of said outer shell; wherein said inner core includes wire terminal cavities to receive said wire terminals such that said wire terminals are behind said bottoms of said open cavaties and further including a plurality of ground spoke plates in said inner core that are grounded, whereby there is one of said ground spoke plates between each wire terminal.

25. The electrical safety device of claim 24, wherein said wire terminals are button connectors to which said wires are connected, said button connectors fitting into said wire terminal cavities.

* * * * *